United States Patent
Oh et al.

(10) Patent No.: US 7,221,096 B2
(45) Date of Patent: May 22, 2007

(54) ACTIVE MATRIX ORGANIC LIGHT EMITTING DISPLAY PANEL

(75) Inventors: Du Hwan Oh, Chungeheongbuk-do (KR); Hoon Ju Chung, Gyeonggi-do (KR)

(73) Assignee: LG.Philips LCD Co., Ltd, Yoido-dong, Youngdungapo-ku, Seoul (KR)

( * ) Notice: Subject to any disclaimer, the term of this patent is extended or adjusted under 35 U.S.C. 154(b) by 197 days.

(21) Appl. No.: 11/119,793

(22) Filed: May 3, 2005

(65) Prior Publication Data

US 2006/0250083 A1    Nov. 9, 2006

(51) Int. Cl.
*H05B 33/00* (2006.01)
*H01L 29/04* (2006.01)

(52) U.S. Cl. .................. 313/512; 257/40; 257/60

(58) Field of Classification Search ........ 313/501–512; 257/40, 57, 59, 60, 67; 345/82, 92
See application file for complete search history.

(56) References Cited

U.S. PATENT DOCUMENTS 7,106,006 B2 * 9/2006 Koyama ................. 315/169.3
7,126,268 B2 * 10/2006 Kitazawa .................. 313/500
7,154,117 B2 * 12/2006 Segawa et al. ............... 257/60

* cited by examiner

*Primary Examiner*—Joseph Williams
(74) *Attorney, Agent, or Firm*—McKenna Long & Aldridge LLP (57) ABSTRACT

An active matrix organic light emitting display panel includes a first substrate including a seal pattern region, a non-display region, and a display region, the non-display region being between the display region and the seal pattern region, a pad connected to the first substrate, and a power line including a routing line connected directly to the pad, and a pixel line for applying a pixel voltage to a plurality of pixels, the routing line having a first portion being in the non-display region and a second portion being in the seal pattern region, and the pixel line being in the display region.

15 Claims, 8 Drawing Sheets

ACTIVE MATRIX ORGANIC LIGHT EMITTING DISPLAY PANEL

BACKGROUND OF THE INVENTION

1. Field of the Invention

The present invention relates to an organic light emitting display panel, and more particularly, to an active matrix organic light emitting display panel having a structure capable of minimizing a resistance of a power line.

2. Discussion of the Related Art

Cathode ray tube (CRT) has drawbacks due to its heavy weight and large volume. Thus, many efforts have been made to research and develop various flat display devices, such as liquid crystal display (LCD) devices, field emission display (FED) devices, plasma display panel (PDP) devices, and organic light emitting display devices, which is also often referred to as organic electro luminescent display devices, as a substitute for CRT devices.

An organic light emitting display device is a self-luminescent type display. In general, the organic light emitting display device emits light by injecting electrons from a cathode and holes from an anode into an emission layer, combining the electrons with the holes, generating an exciton, and transitioning the exciton from an excited state to a ground state. Accordingly, the organic ELD does not require an additional light source and has a light weight, thin profile, and compact size. Further, the organic ELD can operate using a low DC voltage, thereby having low power consumption and fast response time.

Figure 1:
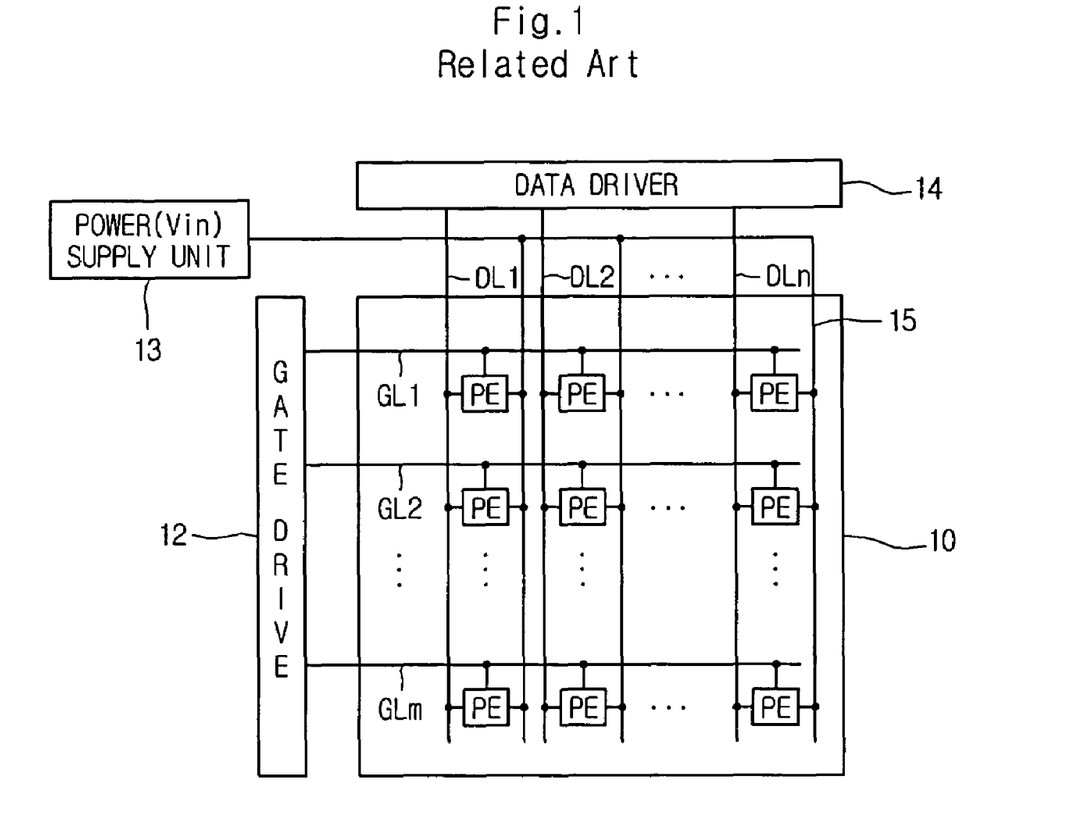
FIG. 1 is a schematic diagram illustrating an active matrix organic light emitting display panel according to the related art.

FIG. 1 is a schematic diagram illustrating an active matrix organic light emitting display panel according to the related art. In FIG. 1, an active matrix organic light emitting display panel includes gate lines GL1 . . . GLm and data lines DL1 . . . DLn arranged on a substrate 10 and intersecting each other, and pixel elements PEs arranged at intersecting portions between the gate lines GL1 . . . GLm and the data lines DL1 . . . DLn. A power line 15 for applying a pixel power from a power supply unit 13 is connected to each pixel element PE.

In particular, the pixel power is applied through a pad (not shown) formed on the panel to the power line 15. When a gate signal of a gate line GL is enabled, a corresponding pixel element PE is driven to generate light corresponding to the strength of a pixel signal of a data line DL. A gate driver 12 is connected to the gate lines GL1 . . . GLm to sequentially drive the gate lines GL1 . . . GLm, and a data driver 14 is connected to the data lines DL1 . . . DLn to supply pixel signals through the data lines DL1 . . . DLn to the pixel elements PEs.

Figure 2:
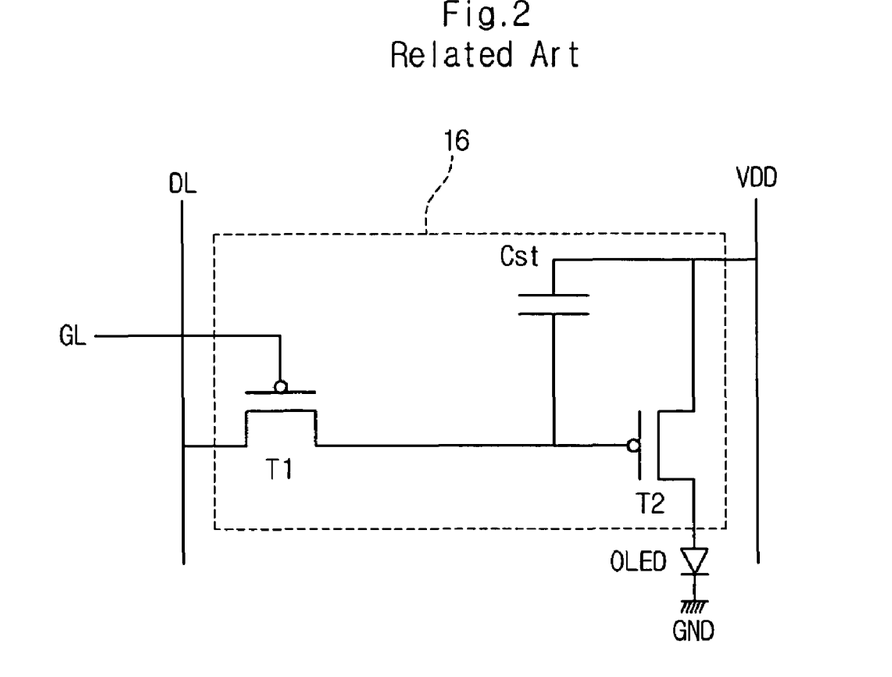
FIG. 2 is a circuit diagram illustrating a pixel element of the active matrix organic light emitting display panel shown in FIG. 1.

FIG. 2 is a circuit diagram illustrating a pixel element of the active matrix organic light emitting display panel shown in FIG. 1. As shown in FIG. 2, the pixel element PE includes an organic light emitting diode OLED or an electro luminescent cell connected to a ground source GND, and an organic light emitting diode (OLED) driving circuit 16 connected between the organic light emitting diode OLED and the corresponding data line DL.

The OLED driving circuit 16 includes a second PMOS thin film transistor (TFT) T2 connected between the organic light emitting diode OLED and a power line VDD to function as a driving element for the organic light emitting diode OLED, a first PMOS TFT T1 connected between the corresponding data line DL and a gate electrode of the second PMOS TFT T2 to function as a switching element for the organic light emitting diode OLED, and a capacitor Cst connected between the power line VDD and a drain electrode of the first PMOS TFT T1.

Thus, when a scan signal, e.g., a LOW signal, from the gate driver 12 (shown in FIG. 1) is inputted to the corresponding gate line GL, the first PMOS TFT T1 is turned on. When the first PMOS TFT T1 is turned on, a video signal of a predetermined strength that is inputted from the corresponding data line DL in synchronization with the scan signal flows through the first PMOS TFT T1 and is then charged in the capacitor Cst. That is, the capacitor Cst is charged with the video signal supplied from the corresponding data line DL, while the LOW signal is inputted to the gate line GL. Further, the capacitor Cst holds the video signal for one frame period. Accordingly, the capacitor Cst supplies the video signal to the organic light emitting diode OLED during one frame period.

However, a voltage drop across the power line VDD must be small in order to uniformly maintain an image quality of the active-matrix organic light emitting display panel. Yet, due to the structure of the active-matrix organic light emitting display panel according to the related art, there is a limit in how much the width or thickness of the power line could be increased for keeping the voltage drop across the power line small. Accordingly, a large voltage drop across the power line cannot be avoided, thereby causing a large difference between voltages applied to pixels connected respectively to the first and last stages of the power line. Thus, an image quality of the organic light emitting display according to the related art is not uniformly maintained.

Figure 3:
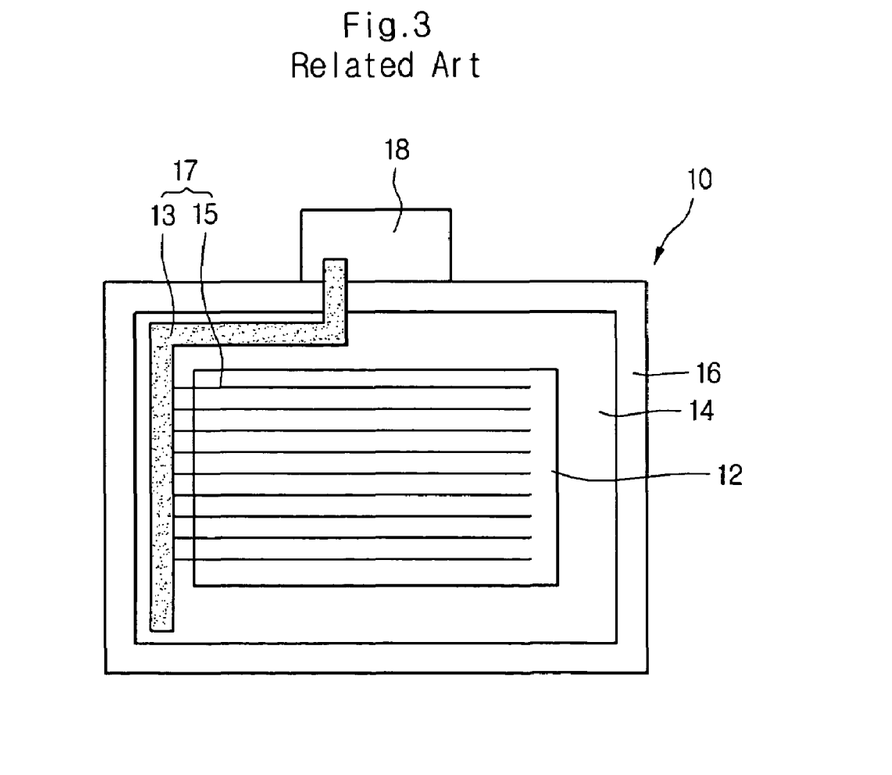
FIG. 3 is a schematic plan view illustrating a power line of an active matrix organic light emitting display panel according to the related art.

FIG. 3 is a schematic plan view illustrating a power line of an active matrix organic light emitting display panel according to the related art. In FIG. 3, a lower substrate 10 and an upper substrate (not shown) are attached together and encapsulated so as to prevent moisture and oxygen from infiltrating into the organic light emitting display panel. In particular, the lower substrate 10 and the upper substrate (not shown) are attached together by a sealant coated on a seal pattern portion 16 at an edge portion of the lower substrate 10. For example, the sealant is material having a property of being hardened by UV light.

A region of the panel includes a display region 12 corresponding to a center portion of the lower substrate 10, and a non-display region 14 between the display region 12 and the seal pattern portion 16. In particular, an image is displayed by pixels (not shown) arranged in the display region 12 in a matrix pattern.

In addition, a power supply unit (not shown) supplies a pixel voltage through a pad 18 to a power line 17, and the power line 17 sends the pixel voltage to the pixels arranged in the display region 12. The power line 17 includes a routing line 13 connected directly to the pad 18 and formed in the non-display region 14, and pixel lines 15 connected to the routing line 13 to apply a pixel voltage to the pixels in the display region 12.

For example, the routing line 13 receives the pixel voltage from the pad 18 and applies the received pixel voltage through the pixel lines 15 to the pixels. Thus, the width or thickness of the routing line 13 of the power line 17 may be increased to reduce the voltage drop across the power line 17 in order to uniformly maintain an image quality of the active-matrix organic light emitting display panel.

However, since the routing line is formed in the non-display region, and the non-display region of the panel is kept small to maximize the display region, the structure of the active-matrix organic light emitting display panel according to the related art cannot sufficiently increase the width or thickness of the power line. Thus, the organic light emitting display according to the related art has a large voltage drop across the power line and is unable to uniformly maintain the image quality.

SUMMARY OF THE INVENTION

Accordingly, the present invention is directed to an active matrix organic light emitting display panel that substantially obviates one or more of the problems due to limitations and disadvantages of the related art.

An object of the present invention is to provide an active matrix organic light emitting display panel that has a structure in which a routing line of a power line is extended in width into a seal pattern portion and the extended portion of the routing line is of a mesh type, thereby making it possible to reduce a voltage drop across the power line.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an active matrix organic light emitting display panel includes a first substrate including a seal pattern region, a non-display region, and a display region, the non-display region being between the display region and the seal pattern region, a pad connected to the first substrate, and a power line including a routing line connected directly to the pad, and a pixel line for applying a pixel voltage to a plurality of pixels, the routing line having a first portion being in the non-display region and a second portion being in the seal pattern region, and the pixel line being in the display region.

In another aspect, an active matrix organic light emitting display panel includes a first substrate including a seal pattern region, a non-display region, and a display region, the non-display region being between the display region and the seal pattern region, a pad connected to the first substrate, and a power line including a routing line connected directly to the pad, and a pixel line for applying a pixel voltage to a plurality of pixels, the routing line being only in the seal pattern region, and the pixel line being in the display region.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 4A:
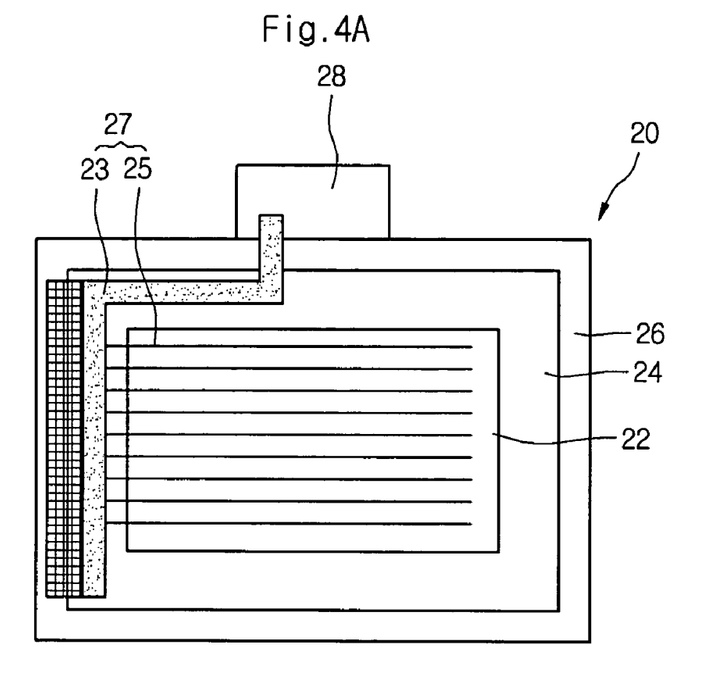
FIGS. 4A and 4B are schematic plan views illustrating a power line of an active matrix organic light emitting display panel according to an embodiment of the present invention.
Figure 4B:
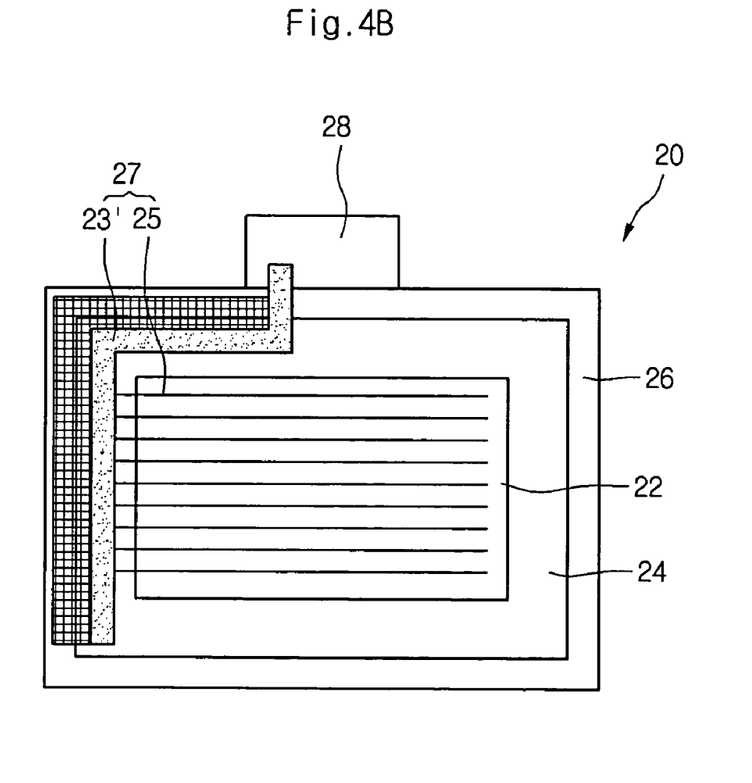

FIGS. 4A and 4B are schematic plan views illustrating a power line of an active matrix organic light emitting display panel according to an embodiment of the present invention. As shown in FIGS. 4A and 4B, an active matrix organic light emitting display panel includes a substrate 20. The substrate 20 may be a lower substrate or an upper substrate of the organic light emitting display panel, and may be attached to a second substrate (not shown). The substrate 20 and the second substrate (not shown) may be encapsulated to prevent moisture and oxygen from infiltrating into the active-matrix organic light emitting display panel. For example, a sealant may be coated in a seal pattern portion 26 of the substrate 20 for attaching the substrate 20 with the second substrate (not shown). Alternatively, the sealant may be coated on the second substrate (not shown) in a portion of the second substrate (not shown) corresponding to the seal pattern portion 26 of the substrate 20 for attaching the substrate 20 with the second substrate (not shown). The seal pattern portion 26 may be along the edges of the substrate 20 and the sealant may be an UV hardening sealant.

The substrate 20 also includes a display region 22 corresponding to a center portion of the lower substrate 20, and a non-display region 24 between the display region and the seal pattern portion 26. In particular, an image is displayed by pixels (not shown) arranged in the display region 22 in a matrix pattern.

In addition, a power supply unit (not shown) supplies a pixel voltage through a pad 28 to a power line 27, and the power line 27 sends the pixel voltage to the pixels arranged in the display region 22. The power line 27 includes a routing line 23 connected directly to the pad 28 and formed in the non-display region 24, and pixel lines 25 connected to the routing line 23 to apply a pixel voltage to the pixels in the display region 22.

Further, the width of the routing line 23 is extended into the seal pattern portion 26, and the extended portion of the routing line 23 is of a mesh type. The extended width of the routing line 23 reduces the total resistance of the power line 27, thereby preventing degradation in the uniformity of an image quality of a pixel region that may be caused by a voltage drop across the power line 27.

In particular, the mesh-type routing line 23 has an opening ratio greater than a predetermined value with respect to the whole routing line 23 to prevent reduction in the attachment force between the lower and upper substrates by the UV hardening sealant. As a result, sufficient UV rays may be radiated through an opening portion of the mesh-type routing line 23 to the UV hardening sealant underneath the mesh-type routing line 23.

Although only the left width of the routing line 23 is extended into the seal pattern portion 26 as shown in FIG. 4A, the left and upper widths of the routing line 23' may be extended into the seal pattern portion 26 as shown in FIG. 4B.

Figure 5A:
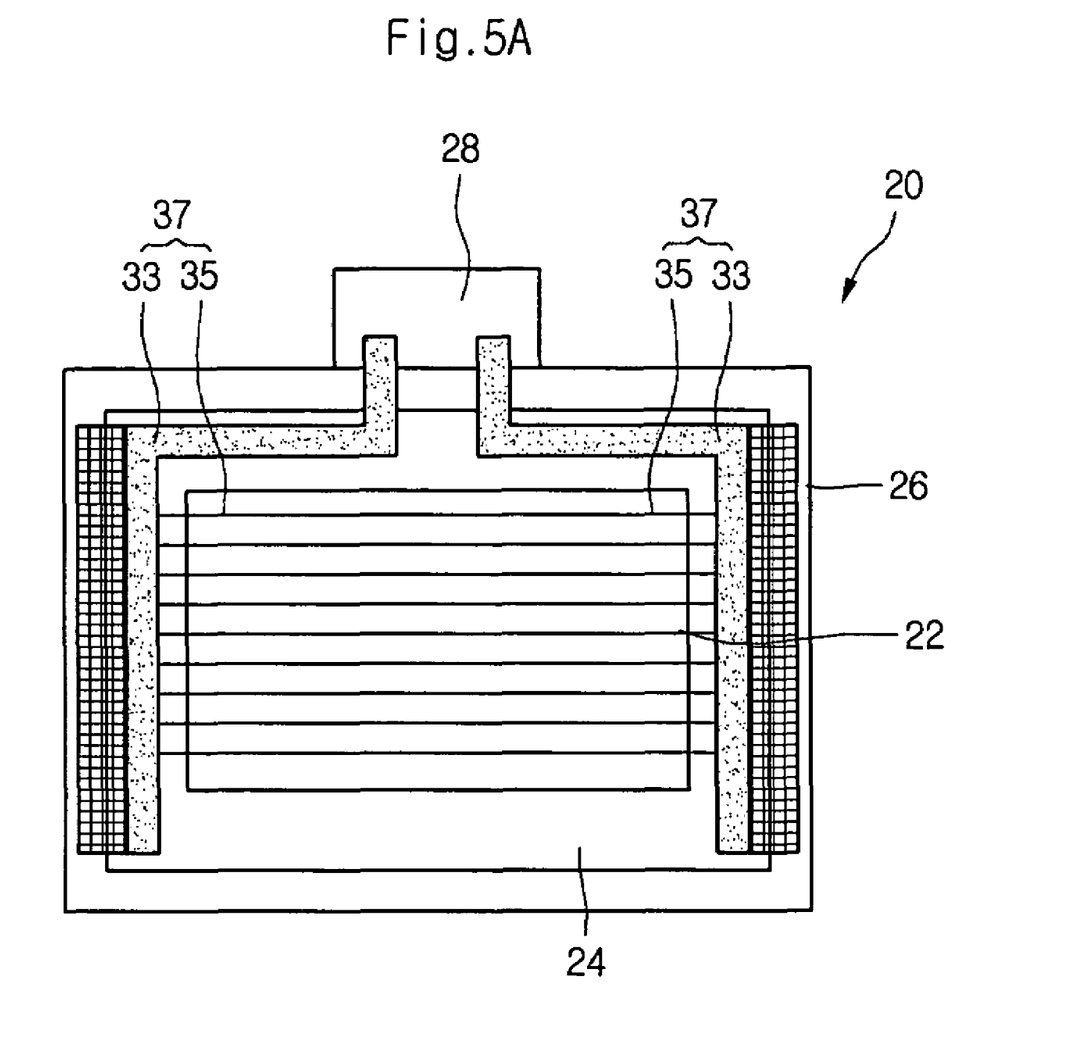
FIGS. 5A and 5B are schematic plan views illustrating a power line of an active matrix organic light emitting display panel according to another embodiment of the present invention.
Figure 5B:
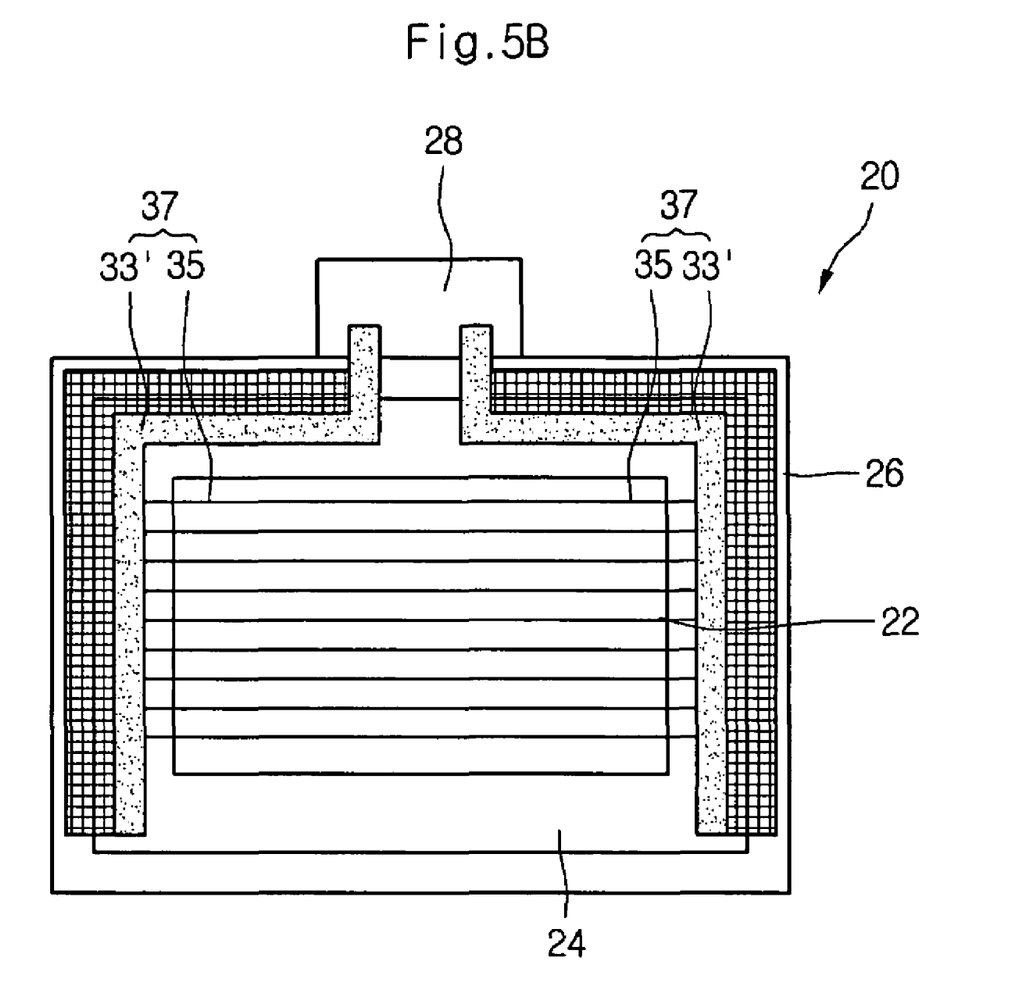

FIGS. 5A and 5B are schematic plan views illustrating a power line of an active matrix organic light emitting display panel according to another embodiment of the present invention. As shown in FIGS. 5A and 5B, an active matrix organic light emitting display panel includes a substrate 20. The substrate 20 may be a lower substrate or an upper substrate of the organic light emitting display panel, and may be attached to a second substrate (not shown). The substrate 20 and the second substrate (not shown) may be encapsulated to prevent moisture and oxygen from infiltrating into the active-matrix organic light emitting display panel. For example, a sealant may be coated in a seal pattern portion 26 of the substrate 20 for attaching the substrate 20 with the second substrate (not shown). Alternatively, the sealant may be coated on the second substrate (not shown) in a portion of the second substrate (not shown) corresponding to the seal pattern portion 26 of the substrate 20 for attaching the substrate 20 with the second substrate (not shown). The seal pattern portion 26 may be along the edges of the substrate 20 and the sealant may be an UV hardening sealant.

In addition, a power supply unit (not shown) supplies a pixel voltage through a pad 28 to a power line 37, and the power line 37 sends the pixel voltage to the pixels arranged in a display region 22 of the substrate 20. The power line 37 includes a pair of routing lines 33 connected directly to the pad 28 and formed in a non-display region 24 of the substrate 20, and pixel lines 35 connected to the routing line 33 to apply a pixel voltage to the pixels in the display region 22.

Further, the pair of routing lines 33 are formed respectively on the left and right portions of the non-display region 24 at the left and right of the display region 22, and the pixel lines 35 connected to a left routing line 33 and to a right routing line 33. Although only the side width of the routing line 33 is extended into the seal pattern portion 26 as shown in FIG. 5A, all the possible widths of the routing line 33' can be extended into the seal pattern portion 26 as shown in FIG. 5B. In particular, the extended portion of the routing line 33 is of a mesh type. Accordingly, the resistance of the power line 37 is further reduced by the pair of the routing lines 33 and 33'.

Figure 6A:
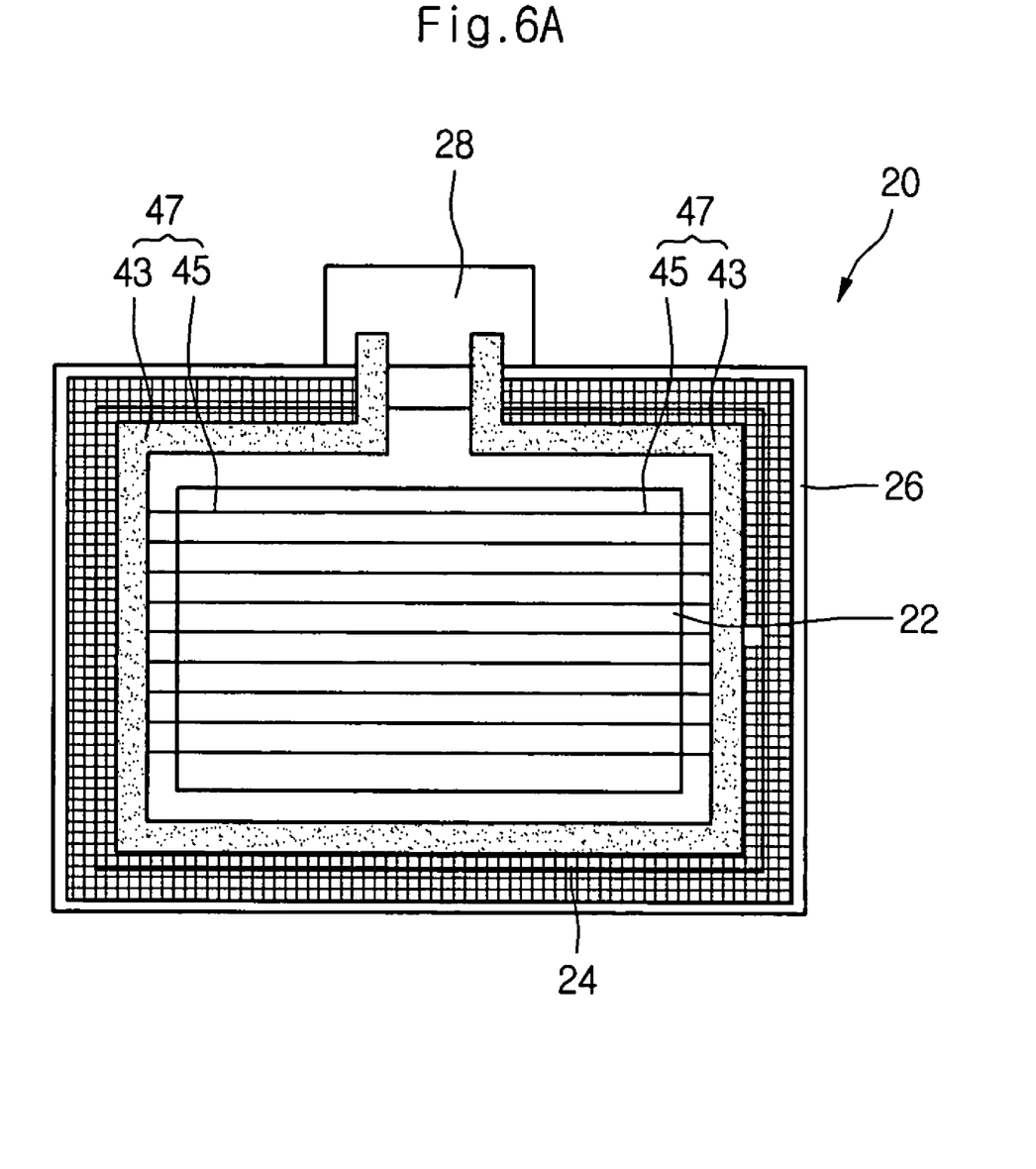
FIGS. 6A and 6B are schematic plan views illustrating a power line of an active matrix organic light emitting display panel according to yet another embodiment of the present invention.
Figure 6B:
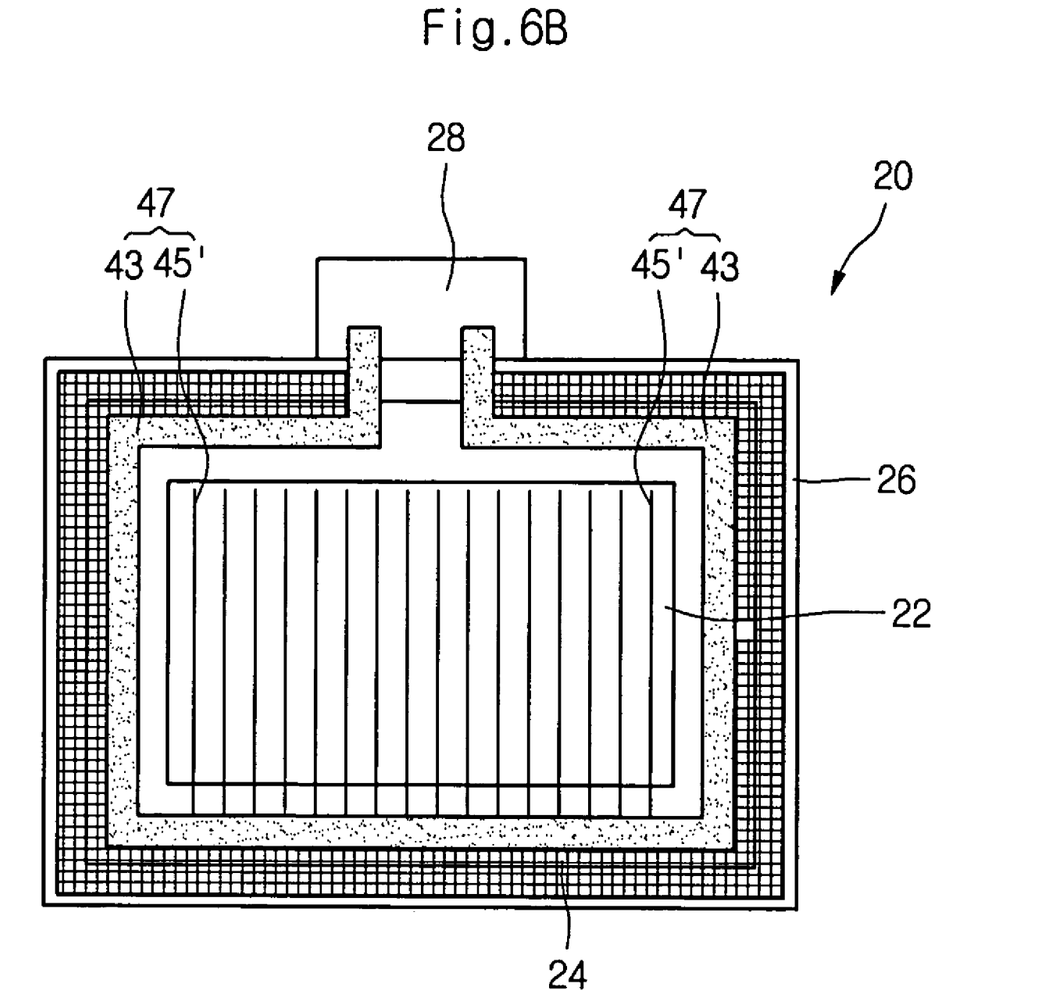

FIGS. 6A and 6B are schematic plan views illustrating a power line of an active matrix organic light emitting display panel according to yet another embodiment of the present invention. As shown in FIGS. 6A and 6B, an active matrix organic light emitting display panel includes a substrate 20. The substrate 20 includes a seal pattern portion 26, a non-display region 24, and a display region 22.

In addition, a power supply unit (not shown) supplies a pixel voltage through a pad 28 to a power line 47, and the power line 47 sends the pixel voltage to the pixels arranged in the display region 22 of the substrate 20. The power line 47 includes a routing line 43 connected directly to the pad 28 and formed in the non-display region 24, and pixel lines 45 connected to the routing line 43 to apply a pixel voltage to the pixels in the display region 22. Further, the routing line 43 is formed in the non-display region 24 surrounding the display region 22, and all the possible widths of the routing line 43 is extended into the seal pattern portion 26. In particular, the extended portion of the routing line 43 is of a mesh type.

In FIG. 6A, the pixel lines 45 are connected to a left routing line 43 and to a right routing line 43. In FIG. 6B, pixel lines 45' are connected to a portion of the routing line 43 along a bottom edge of the display panel. As a result, the resistance of the power line 47 is further reduced by the routing line 43 surrounding the display region 22.

Figure 7:
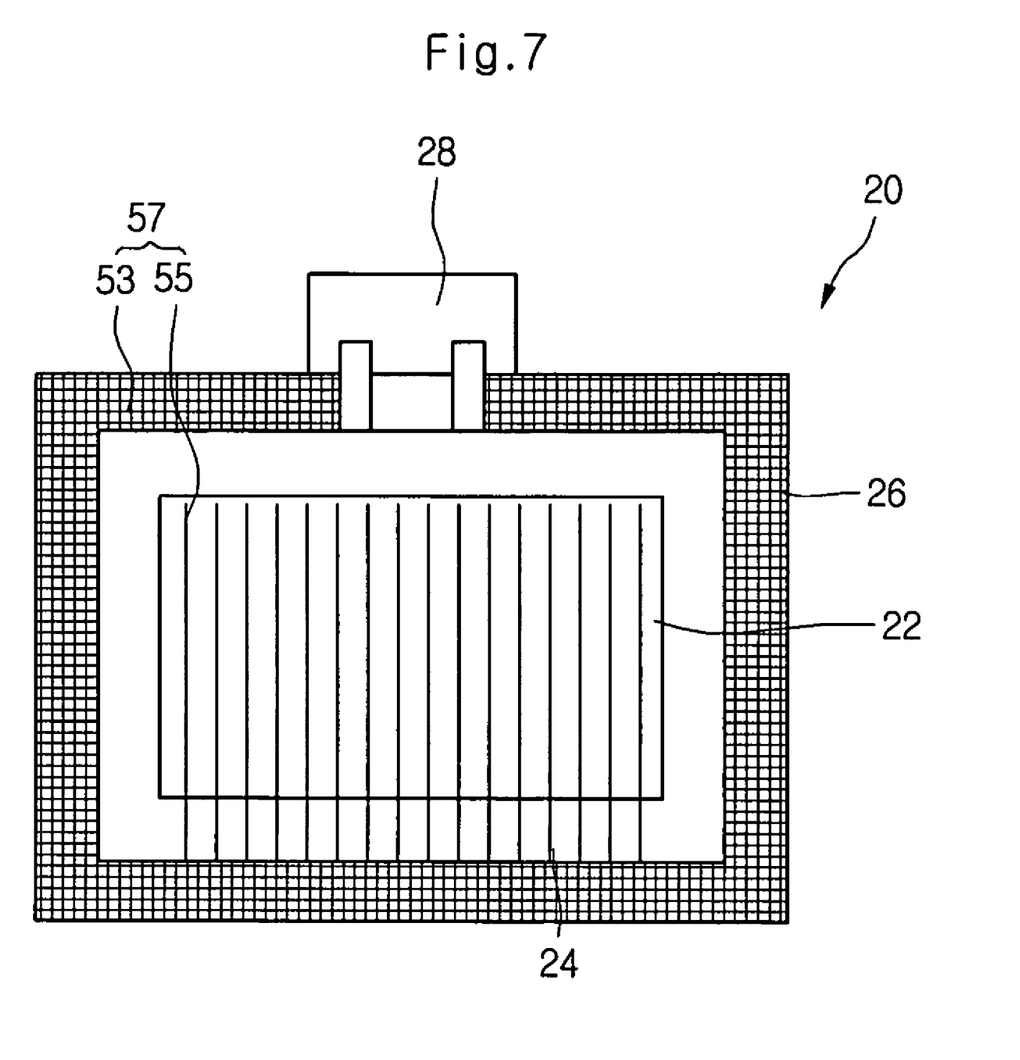
FIG. 7 is a schematic plan view illustrating a power line of an active matrix organic light emitting display panel according to an embodiment of the present invention.

FIG. 7 is a schematic plan view illustrating a power line of an active matrix organic light emitting display panel according to an embodiment of the present invention. As shown in FIG. 7, an active matrix organic light emitting display panel includes a substrate 20. The substrate 20 includes a seal pattern portion 26, a non-display region 24, and a display region 22.

In addition, a power supply unit (not shown) supplies a pixel voltage through a pad 28 to a power line 57, and the power line 57 sends the pixel voltage to the pixels arranged in the display region 22 of the substrate 20. The power line 57 includes a routing line 53 connected directly to the pad 28 and formed in the non-display region 24, and pixel lines 55 connected to the routing line 53 to apply a pixel voltage to the pixels in the display region 22. In particular, the routing line 53 is formed only in the seal pattern portion 26 surrounding the non-display region 24, and the entire of the routing line 53 is in a mesh type.

Pixel lines 55 are connected to a portion of the routing line 53 along a bottom edge of the display panel. As a result, the resistance of the power line 57 is further reduced by the routing line 53 formed only in the seal pattern portion 26 and surrounding the non-display region 24.

Accordingly, an active matrix organic light emitting display panel according to an embodiment of the present invention minimizes a voltage drop across a power line and maintains the attachment force between the upper and lower substrates in a seal pattern region, thereby enhancing uniformity of an image quality of the panel and reducing the size thereof.

It will be apparent to those skilled in the art that various modifications and variations can be made in the active matrix organic light emitting display panel of the present invention without departing from the spirit or scope of the invention. Thus, it is intended that the present invention covers the modifications and variations of this invention provided they come within the scope of the appended claims and their equivalents.

What is claimed is:

1. An active matrix organic light emitting display panel, comprising:
   a first substrate including a seal pattern region, a non-display region, and a display region, the non-display region being between the display region and the seal pattern region;
   a pad connected to the first substrate; and
   a power line including a routing line connected directly to the pad, and a pixel line for applying a pixel voltage to a plurality of pixels, the routing line having a first portion being in the non-display region and a second portion being in the seal pattern region, and the pixel line being in the display region.

2. The display panel according to claim 1, wherein the second portion of the routing line is of a mesh type.

3. The display panel according to claim 1, wherein the seal pattern region is along an edge portion of the first substrate.

4. The display panel according to claim 1, further comprising an UV hardening sealant in the seal pattern region for attaching the first substrate to a second substrate.

5. The display panel according to claim 1, wherein the pad receives a pixel voltage from a power supply unit and sends the received pixel voltage to the power line.

6. The display panel according to claim 1, wherein the routing line is formed in a pair, and the pair of the routing lines are formed respectively on left and right portions of the non-display region.

7. The display panel according to claim 6, wherein the pixel line is connected to the pair of the routing lines.

8. The display panel according to claim 1, wherein the routing line is formed in the non-display region surrounding the display region.

9. The display panel according to claim 1, wherein the pixel line includes a plurality of lines connected to a first portion of the routing line, the first portion of the routing line being along a bottom edge of the display panel.

10. An active matrix organic light emitting display panel comprising:
- a first substrate including a seal pattern region, a non-display region, and a display region, the non-display region being between the display region and the seal pattern region;
- a pad connected to the first substrate; and
- a power line including a routing line connected directly to the pad, and a pixel line for applying a pixel voltage to a plurality of pixels, the routing line being only in the seal pattern region, and the pixel line being in the display region.

11. The display panel according to claim 10, wherein the routing line is of a mesh type.

12. The display panel according to claim 10, wherein the seal pattern region is along an edge portion of the first substrate.

13. The display panel according to claim 10, further comprising an UV hardening sealant in the seal pattern region for attaching the first substrate to a second substrate.

14. The display panel according to claim 10, wherein the pad receives a pixel voltage from a power supply unit and sends the received pixel voltage to the power line.

15. The display panel according to claim 10, wherein the pixel line includes a plurality of lines connected to a first portion of the routing line, the first portion of the routing line being along a bottom edge of the display panel.

* * * * *